US 6,856,378 B2

(12) United States Patent
Machia et al.

(10) Patent No.: US 6,856,378 B2
(45) Date of Patent: Feb. 15, 2005

(54) METHOD OF PHOTOLITHOGRAPHIC EXPOSURE DOSE CONTROL AS A FUNCTION OF RESIST SENSITIVITY

(75) Inventors: Keith J. Machia, Swanton, VT (US); Matthew C. Nicholls, South Burlington, VT (US); Charles J. Parrish, Milton, VT (US); Craig E. Schneider, Underhill, VT (US); Charles A. Whiting, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/691,729

(22) Filed: Oct. 23, 2003

(65) Prior Publication Data

US 2004/0080738 A1 Apr. 29, 2004

Related U.S. Application Data

(62) Division of application No. 10/079,380, filed on Feb. 20, 2002, now Pat. No. 6,674,516.

(51) Int. Cl.[7] .......................... G03B 27/72; G03B 27/80
(52) U.S. Cl. ......................................... 355/69; 355/68
(58) Field of Search .............................. 355/53, 67–71, 355/52, 55, 77; 430/30, 311; 356/399–401

(56) References Cited

U.S. PATENT DOCUMENTS

| | | | | |
|---|---|---|---|---|
| 4,840,874 A | | 6/1989 | Shigemitsu et al. | |
| 5,338,630 A | * | 8/1994 | Yoon et al. | 430/30 |
| 5,363,171 A | * | 11/1994 | Mack | 355/68 |
| 5,626,782 A | * | 5/1997 | Maeda | 219/444.1 |
| 5,656,182 A | | 8/1997 | Marchman et al. | |
| 5,789,124 A | | 8/1998 | Todd | |
| 5,953,128 A | * | 9/1999 | Ausschnitt et al. | 356/399 |
| 5,976,740 A | | 11/1999 | Ausschnitt et al. | |
| 5,985,536 A | | 11/1999 | DeKeyzer et al. | |
| 6,145,118 A | | 11/2000 | Tomita | |
| 6,235,438 B1 | | 5/2001 | Suzuki et al. | |
| 6,239,861 B1 | | 5/2001 | Nara et al. | |
| 6,292,255 B1 | | 9/2001 | McCullough | |
| 6,559,925 B2 | | 5/2003 | Taniguchi | |
| 6,606,533 B1 | * | 8/2003 | Whiting | 700/121 |

OTHER PUBLICATIONS

R.E. Chappelow & M.R. Charney, Research Disclosure, Dec. 1987, No. 284, Kenneth Mason Publicati ns, Ltd., England, "Real Time Control of Photo Exposure Dose".

* cited by examiner

*Primary Examiner*—Henry Hung Nguyen
(74) *Attorney, Agent, or Firm*—Scully, Scott, Murphy & Presser; William D. Sabo, Esq.

(57) ABSTRACT

A predictive method is used to compensate for intermediate batch sensitivities which inevitably occur during resist batch changeover. The compensation is applied to historical dose levels to arrive at a new dose level estimating an optimum dose. When the system discovers that a new batch of resist is loaded to a tool, historical data is used to calculate a reference dose for each tool. A batch factor is continuously calculated and using historical data along with the batch factor, a dose adjustment is made to maintain proper image size.

11 Claims, 6 Drawing Sheets

EXPOSURE CONTROL LOOP
WITH BATCH FACTOR ADJUSTMENTS

METHOD OF PHOTOLITHOGRAPHIC EXPOSURE DOSE CONTROL AS A FUNCTION OF RESIST SENSITIVITY

RELATED APPLICATIONS

This application is a divisional of U.S. application Ser. No. 10/079,380, filed Feb. 20, 2002 which is now U.S. Pat. No. 6,674,516.

DESCRIPTION

1. Field of the Invention

The present invention broadly relates to the field of lithographic systems; and more particularly, to a photolithographic method of maintaining optimum tool performance when photoresist batches are changed on a photolithography cluster. A predictive method is used to compensate for batch sensitivity changes which inevitably occur during resist batch changeover. The compensation is applied to a nominal exposure condition to maintain proper image size.

2. Background of the Invention

In the field of integrated circuits (ICs), photolithography is used to transfer patterns, i.e. images, from a mask, i.e., reticle, containing circuit-design information to thin films on the surface of a substrate, e.g. Si wafer. The pattern transfer is accomplished with a photoresist (e.g., an ultraviolet light-sensitive organic polymer). In a typical image transfer process, a substrate that is coated with a photoresist is illuminated through a mask and the mask pattern is transferred to the photoresist by chemical developers. Further pattern transfer is accomplished using a chemical etchant. One measure of photoresist is its sensitivity (photospeed) which represents the amount of energy required to expose a semiconductor image to a given size.

When batches of photoresist are changed, there is often a detectable difference in sensitivity between the old batch and the new batch. This difference may be due to ambient temperature, e.g., room temperature, aging. The room temperature aging problem may be exacerbated by the fact that new batches are often kept refrigerated. Thus, when a change from the old to the new is made there exists a sensitivity difference between the batch at room temperature vs. the refrigerated batch. Other differences may result from today's complex formulations of photoresist. The complexity of these formulations makes it more difficult to control photospeed. Again, this lack of control dictates the need for a predictive exposure condition adjustment means based on the resultant batch sensitivity differences.

FIG. 1 illustrates a photolithographic processing (fab) environment comprising a mask 110, a stepper device 120 with lens 130 through which the exposure energy 140 is focused on a wafer 150 coated with a photoresist 160. The exposed photoresist results in a resist image 170. The resist image may then be developed on the wafer, resulting in a developed image 180.

It is well known in the field of photolithography that the maintenance of proper image size during a batch change is a problem that must be addressed. Often when a new batch is introduced into the system, old historical data is invalidated, requiring the re-establishment of the image size/exposure condition baseline. As a result, elevated rework and decreased product throughput occur. The related art has not been shown to successfully address this issue in the manner of the current invention wherein batch-to-batch variations in resist sensitivity are used for exposure dose correction.

A related art technique for a projection exposure method is described in Suzuki (U.S. Pat. No. 6,235,438 B1) which is directed to a lithography tool adjustment method wherein an image formation is corrected. Light intensity is changed in this technique, however this process does not include measurement of any of the photoresist parameters as intensity adjustment input.

Another related art method is described in Research Disclosure (RD) (BU886-0412) which generally discusses the need for real time control of photo exposure dose. The graph of the RD disclosure reveals a relationship between image size and time delay from a pre-exposure activation treatment to exposure. The RD disclosure however, does not set forth a method of exposure control based on changing the photoresist batch.

A further related method disclosed in Mack (U.S. Pat. No. 5,363,171), involves a method for in situ photoresist measurements and exposure control. The measurements are used in a feedback loop to control the exposure dose, i.e. the exposure is turned off after predetermined absorption and reflectivity data are measured. The method however, does not address the need to monitor the effects of a change in photoresist batch characteristics.

Another related art technique described in Marchman (U.S. Pat. No. 5,656,182) utilizes feedback control, however, does not address maintenance of proper image size by computing a batch factor as a function of historical and current photoresist batch properties. Rather, it merely performs stage position control as a function of the latent image produced in the substrate.

While it is well known in the art that using an active feedback loop in which image size measurements from a current lot are used to adjust the dosing of a future lot, this current technique reacts too slowly when resist sensitivity changes. The dose adjustment, using this prior art technique will tend to lag behind the dose required for the changing resist sensitivity. Additionally, once the resist sensitivity has changed, it invalidates all of the old historical data, requiring the re-establishment of the image size/dose baseline. The result is elevated rework and decreased product throughput.

Thus, there remains a need for a predictive method which can accommodate both the transition period during resist batch changeover, as well as a method which can make the nominally invalid old data usable again.

SUMMARY OF THE INVENTION

It is an object of the present invention to provide a photolithographic system and method that is capable of adjusting exposure condition levels to maintain proper image size when an old photoresist batch is either mixed with a new batch, or completely replaced by the new batch.

It is another object of the present invention to provide a system and method which avoids rework and cycle time penalties encountered during significant batch sensitivity changes.

It is a further object of the present invention to provide a system and method that decreases engineering monitoring required to re-stabilize a process. The process to be re-stabilized is not limited to photolithographic processes, but may be any process in which a nominal process result is desired while using materials which may deviate from a standard condition.

Yet another object of the present invention is to provide a photolithographic system and method that keeps product more tightly centered in a specification region, rather than permitting substantial image size deviations.

These and other objects and advantages can be obtained in the present invention by introducing a method for calculating a batch factor that is a dose ratio for each reticle. The batch factor may then be used to predict a "mixture-average" sensitivity, and along with historical data, reliably predict proper dosages during the batch transition period.

The basic consideration of this invention is the development of a batch factor (usually a ratio of current to previous performance) to quantify the change to the component and normalize the data to enable other variables to counter the deviation based on previously existing data in order to attain the desired result. The level of detail of the batch factor depends on how critical an accurate result is to the process, if the system is not tightly controlled the batch factor can be approximated; however, if the final result must meet tight tolerances the derivation of a batch factor may become much more detailed and painstaking based on the system in question.

Specifically, in one aspect of the present invention, a method provides better exposure dose control as a function of resist sensitivity changes, for maintenance of proper image size by performing the steps of calculating a baseline exposure condition, i.e., reference dose; as the exposure condition moves, continuously calculating a batch factor as a ratio of an actual dose number to the reference dose; and using the batch factor to adjust historical data.

In another embodiment, the batch factor may be used to adjust both historical data before a batch changeover and more recent historical data upon detection that a new batch of resist is loaded to a tool. In this embodiment, detection of a new resist load is accomplished by the setting and polling of a software batch change flag. Interim batch factors are used as normalization constants thereby creating a "walking batch factor".

In another embodiment, the system and method comprises utilizing a wafer pass counter to track how many shots, i.e., applications of resist, have been applied from the dispense system; using the volume of new resist entering the system in conjunction with known mixing characteristics of the dispense system to calculate "% new material" in the system; and, using the batch factor and %new material parameter to calculate the batch factor when complete batch changeover has occurred. When a next lot is run, the new resist shot count is used to calculate a new % new material factor; this is used with the current steady state batch factor to calculate a projected new batch factor based on modeled data to run the new lot. The current steady state batch factor is determined as follows: after a fixed time or after a fixed number of shots have been dispensed from the wafer, there is calculated a steady state batch factor for the resist representing the behavior of the resist before it starts to degrade; an "aging factor" is applied to the resist sensitivity and, after a known amount of time at room temperature, the aging factor is calculated and multiplied with the current steady state batch factor.

Advantageously, the system and method of this invention are applicable for any application involving lithography, e.g., photolithography, including g-line, i-line, DUV (248 nm), 193 nm, EUV, X-ray, and e-beam exposures or even other microelectronic uses including etch, Chemical Mechanical Polish, Chemical Vapor Deposition, etc. The concept of a batch factor implementing the use of prior data is applicable not only to semiconductor wafer fabricators, but to any process that uses materials which may deviate from a standard condition, thus affecting the outcome of the process. Some example of non-microelectronic uses include flat screen displays, food, pharmaceutical, and chemical production.

BRIEF DESCRIPTION OF THE DRAWINGS

The present invention, which, in one aspect, provides a photolithographic exposure dose adjustment method as a function of photoresist, i.e., resist sensitivity changes will now be described in more detail by referring to the drawings that accompany the present application. It is noted that in the accompanying drawings like reference numerals are used for describing like and corresponding elements thereof.

DETAILED DESCRIPTION OF THE INVENTION

Figure 1:
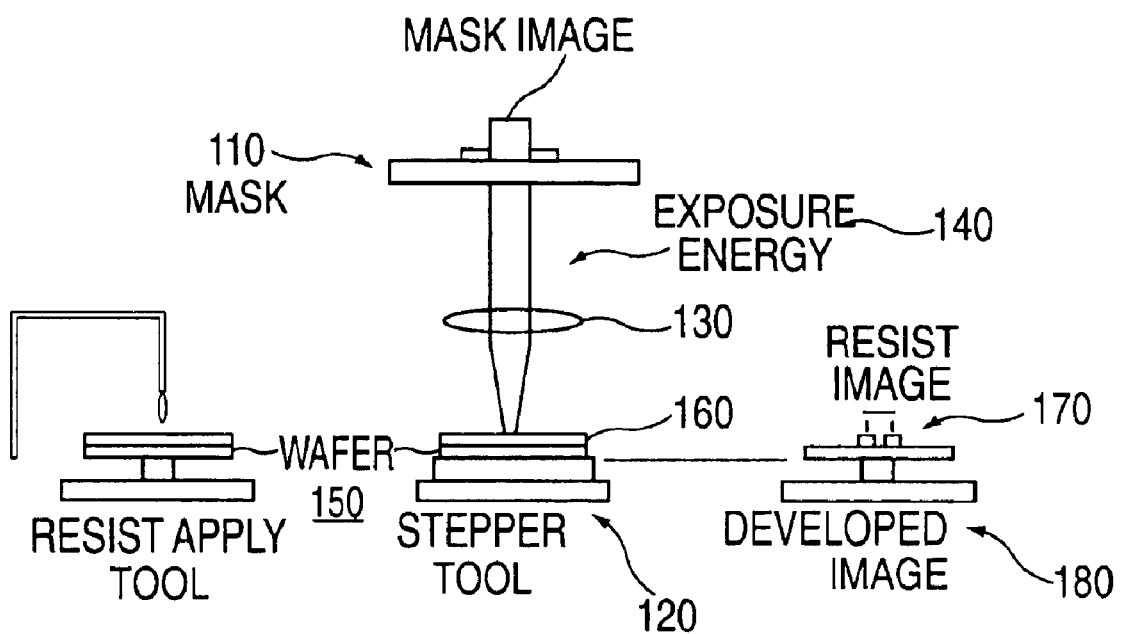
FIG. 1 depicts the main components of a photolithographic processing system representing the environment of Applicants' invention.

The following terms, constants and equations used throughout this disclosure are now defined:

Define Terms:

Dose: Energy density delivered by photolithography system. Typical units are $mJ/cm^2$, though other units may be used.

Optimum Dose: Calculated exposure dose required to exactly meet image size target. May be calculated using prior art metrological means, however, convergence to the optimum dose is aided by the New Dose, i.e. $Dose_{new}$ calculation of the current invention.

Batch Factor: Ratio of optimum doses for a selected photoresist lot vs. prior photoresist lot.

Mixing Factor: Normalized amount of new material mixed with old material in system. Range of 0–1; all old material gives value of 0; all new material gives value of 1.

Steady State Batch Factor: Batch factor of new resist at infinite mixing (mixing factor=1)

Material: a substance whose properties are under control by this invention, e.g., photoresist.

Define Constants:

$t_0$=Time at which new material is introduced to system.

$t_m$=Time when most recent product lot was run.

$t_{new}$=Time when lot for which dose will be calculated will be run.

$D_0$, $BF_0$, $MF_0$=Dose, Batch Factor, Mixing Factor (respectively) of first product produced immediately after $t_0$.

$BF^*_k$=Batch Factor with time-dependent photoresist sensitivity effects removed.

$n_{ref}$=Number of lots prior to batch change on which material property references are made.

$n_{shot,k}$=Number of shots of material applied to product since $t_0$ for kth lot run.

$n_{shot}$=Number of shots of material applied to product since $t_0$ for most recently measured lot.

$n_{shot,new}$=Number of shots of material applied to product since $t_0$ for lot which requires dose calculation.

$MF(n_{shot,k})$=Calculated Mixing Factor based on number of shots of material applied to product since new material was introduced to system for the kth lot run.

$MF(n_{show,new})$=Calculated Mixing Factor based on number of shots of material applied to product since new material was introduced to system for lot which requires dose calculation.

$Dose_{ref}$=Reference dose used to calculate Batch Factor.

$Dose_{new}$=Calculated dose for next lot based on historical data.

$n_{calc}$=Number of lots used to calculate new product dose or new process parameter value.

m=Number of lots run since new material added to system.

k=Range variable for summations. (Note that a negative summation range represents lots prior to the batch changeover; a zero summation range, i.e., the zeroth element represents the $1^{st}$ lot immediately after the batch changeover; a positive summation range represents lots after the batch changeover)

τ=Characteristic time constant for exponential sensitivity decay.

Define a Set of Linear Numerical Vectors:

Dose: ($Dose_{-n}$, $Dose_{-n+1}$, ... $Dose_0$, $Dose_1$, $Dose_{m-1}$), where $Dose_k$ is the optimum dos calculated for the $k^{th}$ lot run based on its measurement data.

Batch Factor: ($BF_{-n}$, ... $BF_0$, ... $BF_{m-1}$)

Ultimate, (Steady State) Batch Factor: ($UBF_0$, ... $UBF_{m-1}$)

Mixing Factor: ($MF_{-n}$, ... $MF_0$, ... $MF_{m-1}$), where mixing factor represents the percentage of new material mixed with old being delivered to the product.

t: Current Time of the most recent lot of product runTime: ($t_{-n}$, ... $t_0$, ... $t_m$)

Figure 2:
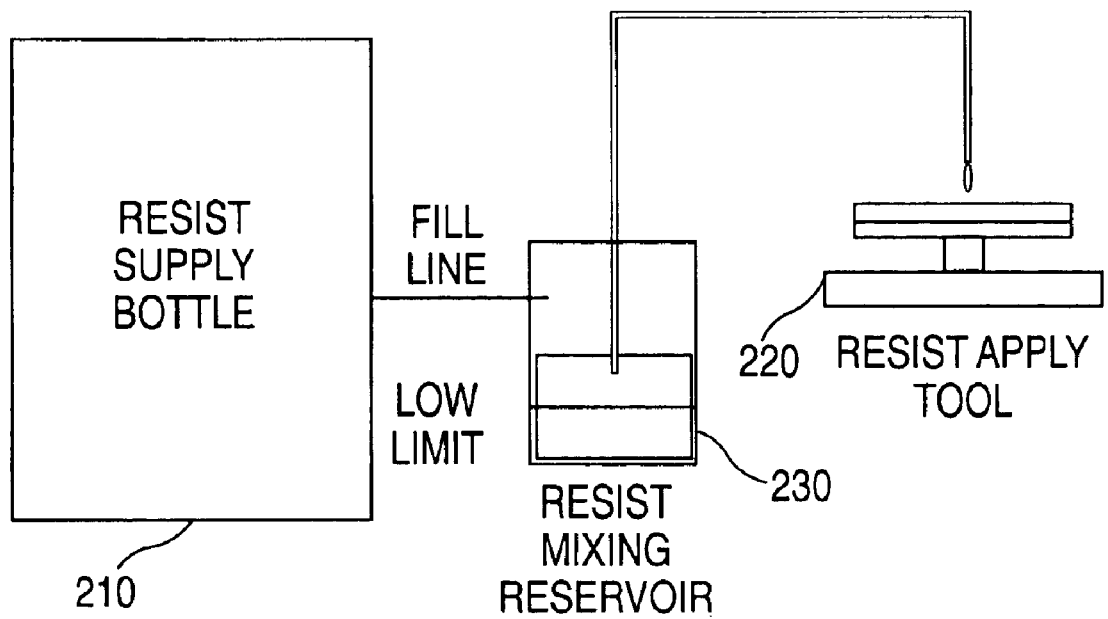
FIG. 2 shows a resist supply bottle, mixing reservoir and application tool.
Figure 3:
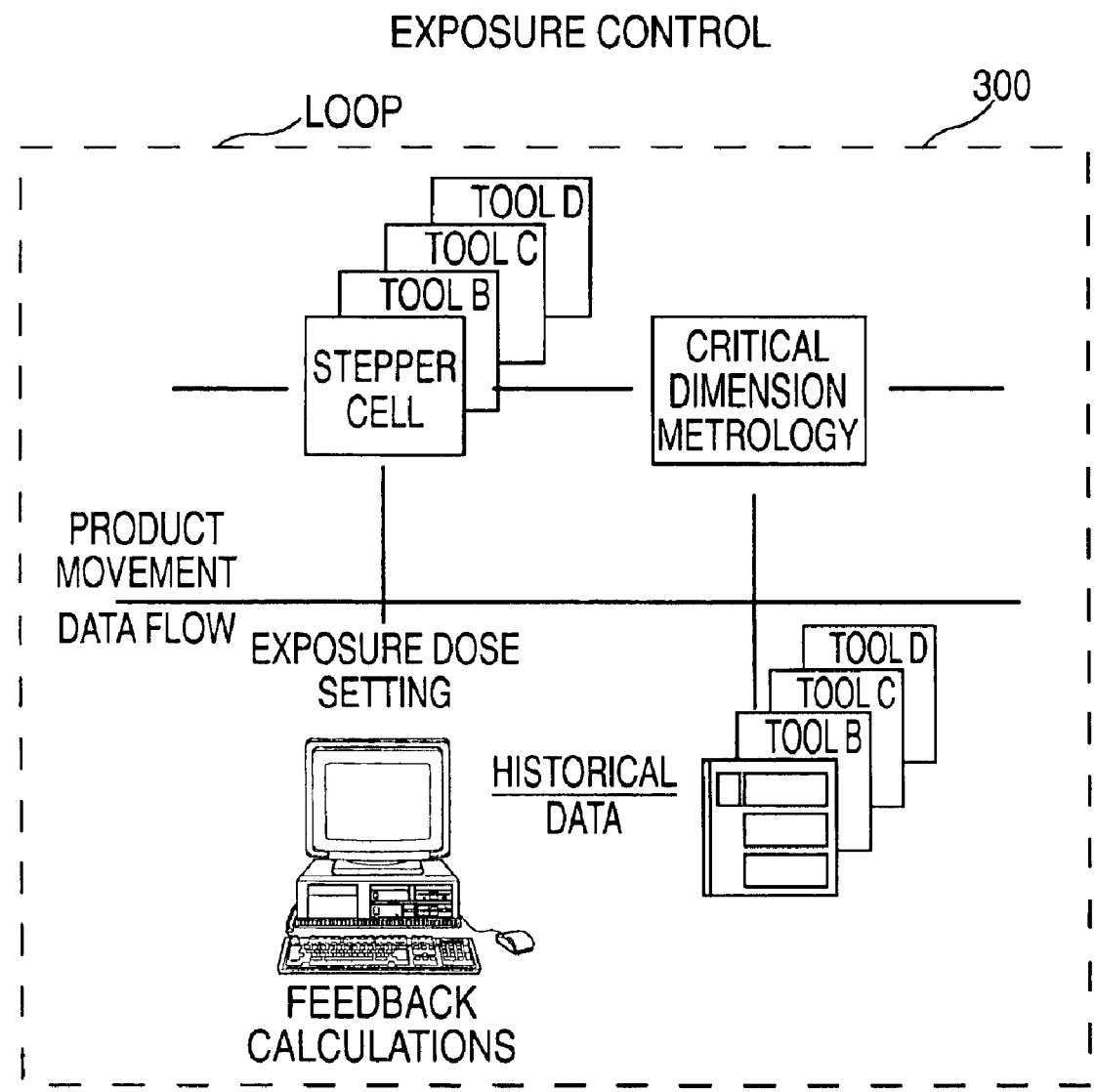
FIG. 3 shows the prior art data flow for exposure dose calculations.
Figure 4:
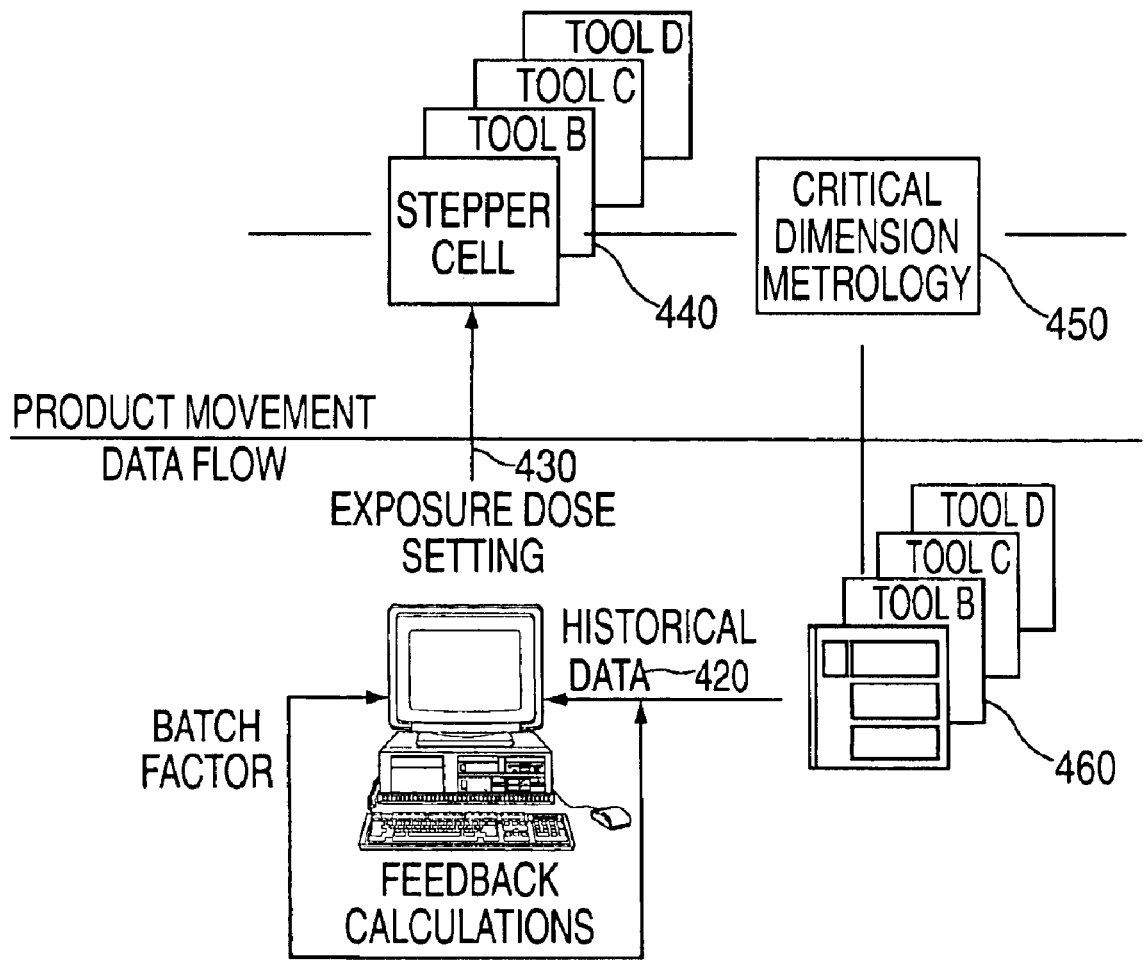
FIG. 4 shows the exposure dose calculation data flow including the current invention processes.
Figure 6:
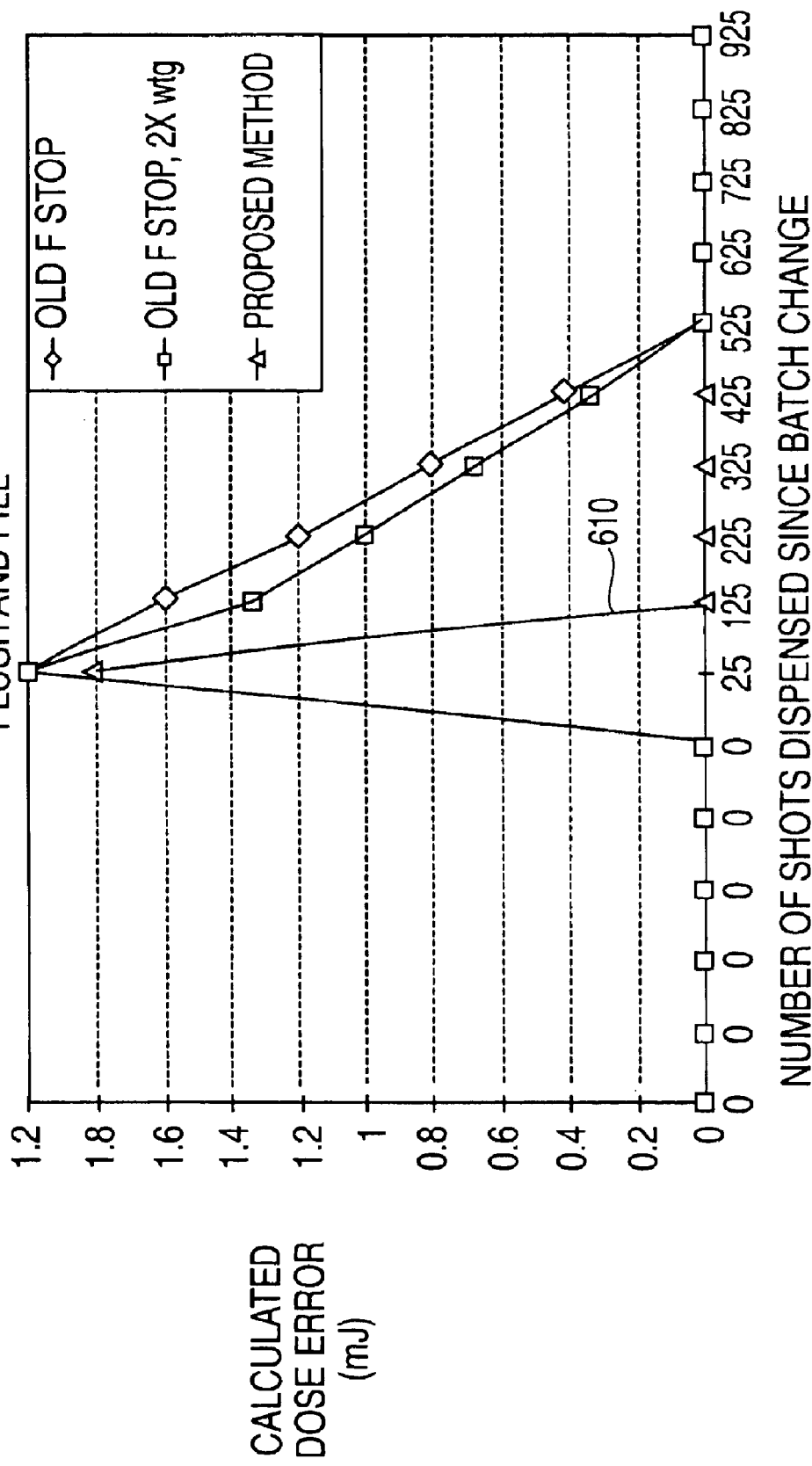
FIG. 6 shows the calculated dose error versus number of shots dispensed since batch change ("flush and fill" old and new method).

In accordance with the present invention, as shown in FIG. 2, when a new container of resist 210 is loaded to a tool 220, an indication is recorded, e.g., a software batch change flag is triggered in the computer controlled photolithographic process. When the flag has been set, historical data, comprising previous optimum exposure doses and their respective batch factors from before the time that the new resist was loaded, is used to calculate a reference dose for each reticle on the tool. This embodiment assumes that the batch changeover is immediate with substantially no residual old resist material left in the dispense mechanism ("flush and fill"). As shown in FIG. 6, 610, the inventive method results in relatively quick convergence to an optimum dose, i.e., in 125 shots, compared to prior art metrology without the batch factor feedback loop, i.e. convergence in 525 shots. Reference dose calculations are performed in the traditional manner using a feedback control loop on the historical data. These reference dose calculations are performed for old resist product, i.e., number of lots processed with old resist prior to a batch change representing an average of historical doses weighted by their respective batch factors, as set forth by the equation:

$$Dose_{ref} = \frac{\sum_{k=-1}^{-n_{ref}} (Dose_k / BF_k)}{n_{ref}}$$

Historical data typically comprises optimum reticle doses, i.e., optimum doses, used from past lot runs using the current reticle/tool combination. As the new resist enters the system, and the dose required to maintain proper image size moves, a new dose ratio, i.e., batch factor for the most recent lot is continuously calculated for each reticle by dividing the optimum actual dose used for the most recent photoresist lot, $Dose_{m-1}$, by the optimum dose for prior lots, $Dose_{ref}$. This batch factor for the most recent lot of product already run comprises the equation:

$$BF_{m-1} = Dose_{m-1}/Dose_{ref}$$

For all other lot runs after the batch change, under "flush and fill" conditions, i.e., where resist sensitivity changes may be modeled by a step function, the respective batch factors are not calculated, but rather are assigned to the most recently calculated batch factor after the batch changeover, i.e., assign $BF_0$, ... $BF_{m-2}$ ... =$BF_{m-1}$, thus giving the batch factors a unity value, i.e., a value of one. The assignment results in a batch factor of unity for all data after the batch changeover. Thus, each batch factor is used to adjust only historical data from before the time that the new resist was loaded, thereby improving the prior art dose predicting capability during the batch transition period. Typically, historical data comprises the optimum reticle dose calculated for previous runs with a particular reticle/tool combination. This historical data may also include batch factors from previous runs. All data since the batch change flag was set is assumed to be valid, i.e. the batch factor adjustment is inhibited, (batch factor=1), on data generated after the new resist has been loaded. The new exposure dose which is corrected by the batch factor, represents a moving average of all doses used for the number of lots in the system. The new dose calculation is governed by the equation:

$$Dose_{new} = \frac{\sum_{k=m-n_{calc}}^{m-1} \left(Dose_k * \frac{BF_{m-1}}{BF_k}\right)}{n_{calc}}$$

The new dose and most recent batch factor are recorded to maintain historical data. The photolithographic tool is adjusted to an exposure dose equal to the new dose, which maintains proper image size for a next lot.

In accordance with a second embodiment of the present invention, a reference dose for old resist lots processed prior to batch changeover is calculated:

$$Dose_{ref} = \frac{\sum_{k=-1}^{-n_{ref}} (Dose_k / BF_k)}{n_{ref}}$$

Figure 5:
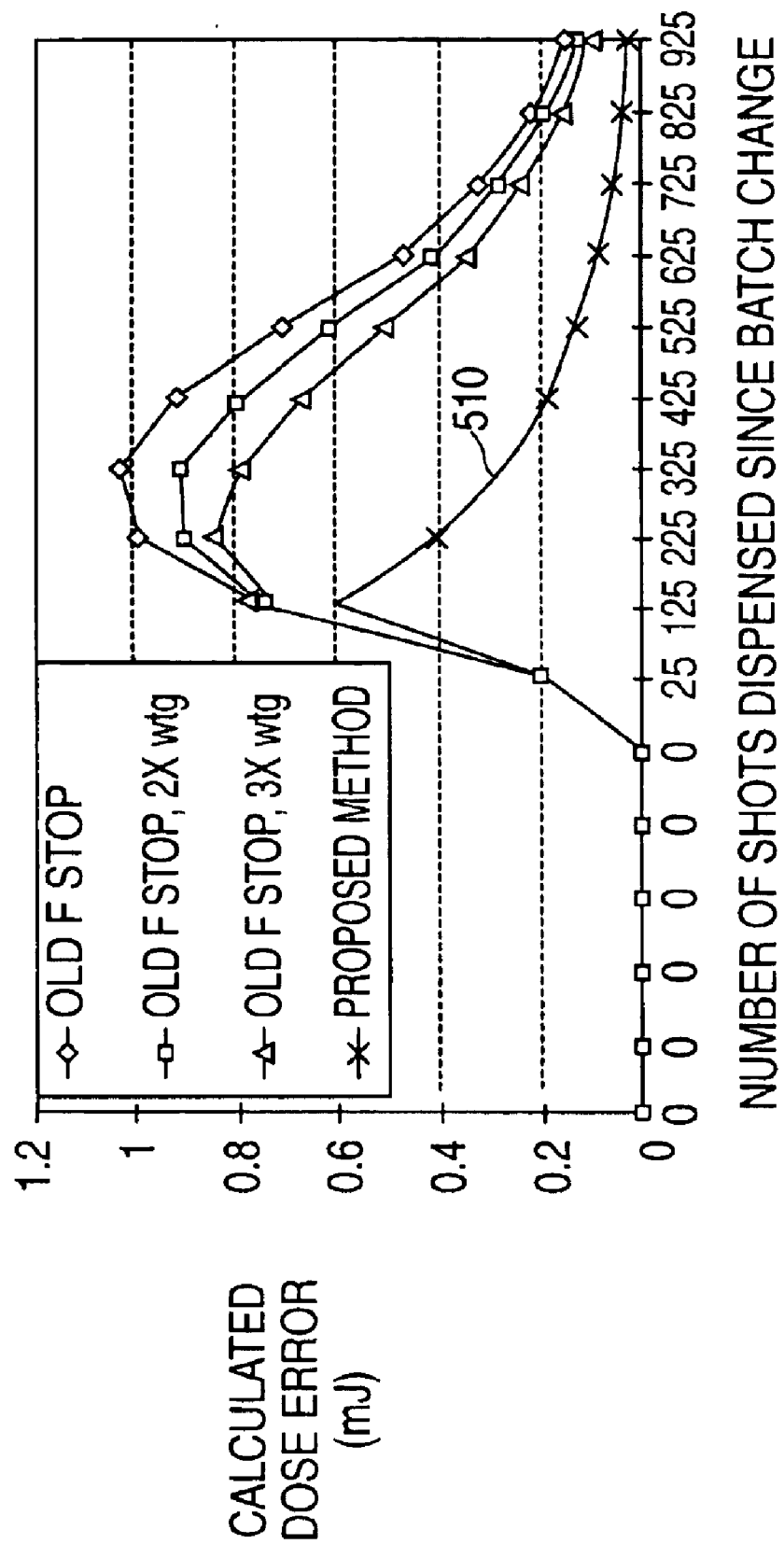
FIG. 5 shows the calculated dose error versus number of shots dispensed since batch change (old and new method where immediate mixing takes place)

The new batch factor is used to adjust data since the batch change flag was set, i.e., a batch factor for the most recent lot is calculated: $BF_{m-1}=Dose_{m-1}/Dose_{ref}$. The assumption in this embodiment is that some mixing is occurring between the old resist and the new resist, therefore adjustments will be made based on all historical data including the data since the batch changeover. As shown in FIG. 5, 510, convergence to an optimum dose, using the present inventive batch factor feedback method occurs much quicker than without it, i.e., calculated dose error from approximately 75 shots throughout the remaining number of shots dispensed is consistently lower using the invention than without. Note that the current method does not assign $BF_0$, ... $BF_{m-2}$ ... =$BF_{m-1}$.

Interim batch factors are used as normalization constants, i.e., historical data is adjusted for each interim batch factor. Accordingly, the equation governing the new dose calculation with a batch factor correction is:

$$Dose_{new} = \frac{\sum_{k=m-n_{calc}}^{m-1}\left(Dose_k * \frac{BF_{m-1}}{BF_k}\right)}{n_{calc}}$$

An optimum dose and most recent batch factor are recorded to maintain historical data. The photolithographic tool is then adjusted to an exposure dose equal to the new dose, for maintaining proper image size.

In accordance with a third embodiment of the present invention, mixing factors are included in the batch factor calculation in order to model changing percentages of new resist based on flow characteristics of the dispense mechanism. The assumption is that mixing occurs between the old resist and new resist until the old resist is gradually flushed out of the mechanism. In this case, a reference dose for product, i.e., old resist, prior to batch change is calculated:

$$Dose_{ref} = \frac{\sum_{k=-1}^{-n_{ref}}(Dose_k/BF_k)}{n_{ref}}$$

A reference Batch Factor for the old resist applied prior to batch changeover, i.e., an old reference batch factor is then calculated:

$$BF_{old,ref} = \frac{\sum_{k=-1}^{-n_{ref}} BF_k}{n_{ref}}$$

Next, the Batch Factor for the most recent lot is calculated:

$$BF_{m-1} = Dose_{m-1}/Dose_{ref}$$

Mixing factors for determining a percentage of new material in the dispense mechanism are calculated by using the volume of new resist entering the system, in conjunction with known mixing characteristics of the dispense system as modeled by an appropriate fluid flow model, for example, this particular embodiment uses a known fluid flow model that assumes the flow/mixing characteristics of a closed container. A record indicating a count of how many shots of resist have been applied from the system since the new resist was loaded is maintained. This record could be maintained, for example, by starting a wafer pass counter when the new resist has been loaded. The shot count is used in the mixing factor calculations. The resulting mixing factor equations for most recent lot and next, i.e., new lot based on known mixing properties of the system are as follows:

$$MF_{m-1} = MF(n_{shot,m-1})$$

$$MF_{new} = MF(n_{shot,new})$$

The reference batch factor, i.e., the batch factor for the old resist prior to changeover, the most recent batch factor, and the mixing factor for the most recent lot are used to calculate a steady state batch factor, $UBF_{m-1}$, when complete batch changeover has occurred:

$$UBF_{m-1} = BF_{old,ref} + (BF_{m-1}Bf_{old,ref})/MF_{m-1}$$

A new reference batch factor for the new resist applied to a next lot is calculated based on the steady state batch factors for all other lots which have been processed after the new resist has entirely replaced the old resist:

$$BF_{new,ref} = \frac{\sum_{k=0}^{m-1} UBF_k}{m}$$

The batch factor for the next lot is calculated based on the old reference batch factor, the next, i.e., new lot mixing factor, and the new reference batch factor:

$$BF_{new} = BF_{old,ref} + MF_{new} * (BF_{new,ref} - BF_{old,ref})$$

$BF_{new}$ represents a predicted batch factor for the next lot. The new exposure dose is calculated based on the batch factor for the next lot combined with old data, i.e., historical data, as follows, where:

$$BF_{new} = BF_m; \text{ and,}$$

$$Dose_{new} = \frac{\sum_{k=m-n_{calc}}^{m-1}\left(Dose_k * \frac{BF_m}{BF_k}\right)}{n_{calc}}$$

An optimum dose and most recent batch factor are recorded to become historical data.

The photolithographic tool is adjusted to an exposure dose equal to the new dose, which maintains proper image size. Additionally, it should be noted that the method of this third embodiment provides the capability to seed the batch factor into the $Dose_{new}$ calculations before the new lot is ever processed.

In accordance with a fourth embodiment of the present invention, in addition to the previously described steps, after a predetermined amount of time, or a predetermined number of shots dispensed from the wafer, the current steady state batch factor for the resist representing the behavior of the resist before it starts to degrade, is calculated. Data selected from either monitor data, product manufacturing data, or vendor supplied data is used to apply an aging factor to the resist sensitivity. After a predetermined amount of time at an ambient, e.g., room temperature, the aging factor is calculated and multiplied by the steady state batch factor, thus anticipating predictable aging-related sensitivity shifts. The resultant equations are as follows: Reference dose for product immediately following batch change dose stabilization is calculated:

$$Dose_{ref} = \frac{\sum_{k=-1}^{-n_{ref}}(Dose_k/BF_k)}{n_{ref}}$$

An exponential decay (one form of aging factor) of the required dose is applied:

$$Dose_t = Dose * e^{-(t-t0)/r}$$

The Batch Factor for the most recent lot is calculated:
$BF_{m-1} = Dose_{m-1}/Dose_{ref}$ Previously calculated batch factors are not overwritten. The batch factors with resist sensitivity effects removed are calculated:

$$BF^*_{m-1} = BF_{m-1} e^{(t_{m-1}-t_0)/\tau}$$

The new dose based on old data is calculated, also providing for subsequent resist aging:

$$Dose_{new} = \left[\frac{\sum_{k=m-n_{calc}}^{m-1}\left(Dose_k \frac{BF^*_{m-1}}{BF^*_k}\right)}{n_{calc}}\right] * e^{-(t_{new}-t_0)/\tau}$$

An optimum dose and most recent batch factor are recorded to maintain historical data. The photolithographic tool is adjusted to an exposure dose equal to the new dose, which maintains proper image size.

Additionally, a computer with non-volatile, i.e., hard drive, storage capability is provided for performing feedback enhancement calculations comprising the batch factor required to produce an exposure dose setting. The storage is used for maintaining a database with the relevant historical information stored therein, including but not limited to, Dose history CD history, target CD, and Batch Factor. The computer executes all processing necessary to support required database access, historical dose and modifying batch factor calculations. The computer may also be provided with an interface for sending the batch factor corrected exposure dose setting to the exposure tool for exposure control.

Thus, the present technique can achieve image size control when batch variations occur in the system. Additionally, various levels of resist sensitivity changes, tool and reticle combinations may be successfully tracked so that application of a batch factor to the appropriate historical data results in maintaining proper image size when those combinations are used. Several examples are:

1) Image size sampling is adjusted to insure that sudden step-function changes in resist sensitivity within a lot are properly measured and the product dispositioned correctly;

2) Data from the batch change on one tool is used to successfully predict behavior and batch factors on another tool;

3) Data from one reticle level are used to successfully predict behavior and batch factors on another level;

4) Data from one reticle on the same level are used to successfully predict behavior and batch factors on another reticle from the same level;

5) Data from the resist vendor are used to calculate the sensitivity difference between lots and the resultant batch factor is seeded in the system when a change is made. Seed data is compensated to fit the user application;

6) Batch factor can be used when feeding product from multiple coating production tools to a single exposure tool.

Another aspect of the invention relates to a generalized process control algorithm comprising a system, the details of which are described below, that can optimize a process parameter value recommendation for a new lot of material as a function of batch-to-batch variations in properties of the material thereby decreasing the process parameter value error resulting from the variations. A batch factor, BF, is calculated based on the ratio between the most recently observed process parameter value and an average of historically observed process parameter values weighted by their respective historical batch factor The batch factor is next used in the computation of a new process parameter value V. The new process parameter value, $V_{new}$, represents a moving average of all V used for the number of lots in the system. The $V_{new}$ calculation is governed by the equation:

$$V_{new} = \frac{\sum_{k=m-m_{calc}}^{m-1}\left(V_k * \frac{BF_{m-1}}{BF_k}\right)}{n_{calc}}$$

The new process parameter value, $V_{new}$, is then used in the process as an estimate to an optimum process parameter value, $V_{optimum}$. For each lot processed, the respective $V_{optimum}$ and batch factors are saved as historical data, thus completing a feedback loop. Running this feedback loop results in a relatively quick convergence to the optimum process parameter value, as compared to running measurements without it.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

What is claimed:

1. A system for controlling exposure dose in a lithographic exposure tool for exposing a photoresist material applied to semiconductor wafers, and a reticle develops images in the photoresist material applied to the semiconductor wafers, and wherein the photoresist material is subject to batch changeover and the system operates with successive lot runs, including previous lot runs that were run prior in time and a current lot run that is currently being run, comprising:

means for adjusting said exposure dose as a function of resist sensitivity changes, further comprising;
  a) means for calculating a batch factor that is an exposure dose ratio of current exposure dose performance to previous exposure dose performance by using historical data, comprising batch factors and optimum exposure doses from at least one previous lot run that was run prior in time to the current lot run;
  b) said means for adjusting said exposure dose comprises means for calculating a value of said exposure dose based on said calculated batch factor whereby said exposure dose in said lithographic exposure tool is controlled.

2. The system for controlling exposure dose as claimed in claim 1, wherein said means for adjusting said exposure dose uses said optimum exposure doses from said historical data.

3. The system for controlling exposure dose as claimed in claim 1, wherein:
  said resist sensitivity changes correspond to a step change function from an old resist sensitivity to a new resist sensitivity; and,
  said means for calculating a batch factor calculates a batch factor of said exposure dose ratio of 1 for all lots run subsequent to said step change function.

4. The system for controlling exposure dose as claimed in claim 1, comprising:
  a) means for obtaining said calculated batch factor for a lot run prior to an initial of said resist sensitivity changes;

b) means for obtaining said calculated batch factor for a most recent previous lot run;

c) means for calculating a mixing factor for a previous lot run for modeling said resist sensitivity changes of said previous run lot due to flow characteristics of said resist;

d.) means for calculating a mixing factor for a next lot run for modeling said resist sensitivity changes of said next lot run due to said flow characteristics of said resist;

e) means for calculating said calculated batch factor for a new lot run using the calculated batch factors of step a) and step b), and the calculated mixing factors of step c) and step d);

f) means for calculating said value of said exposure dose based on said historical data and said calculated batch factor for said new lot run.

5. The system for controlling exposure dose as claimed in claim 1, wherein:

a means for applying an aging factor, to compensate for an ambient temperature of said resist, to said calculated batch factor to increase accuracy of said calculated batch factor;

means for applying said aging factor, to compensate for said ambient temperature of said resist, to said value of said exposure dose to increase accuracy of said calculating a value of said exposure dose.

6. A computer program product comprising:

a computer usable medium having computer readable program code embodied therein for controlling exposure dose in a lithographic exposure tool for exposing a photoresist material applied to semiconductor wafers, and a reticle develops images in the photoresist material applied to the semiconductor wafers, and wherein the photoresist material is subject to batch changeover and the system operates with successive lot runs including previous lot runs that were run prior in time and a current lot run that is currently being run, the computer readable program code in said computer program product comprising:

a) first computer readable program code for causing the computer to calculate a batch factor that is an exposure dose ratio of current exposure dose performance to previous exposure dose performance by using historical data, comprising batch factors and optimum exposure doses from at least one previous lot run that was run prior in time to the current lot run;

b) second computer readable program code for causing the computer to adjust said exposure dose wherein said adjustment comprises calculating a value of said exposure dose based on said calculated batch factor whereby said exposure dose in said lithographic exposure tool is controlled.

7. The computer program product for controlling exposure dose as claimed in claim 6, wherein said second computer readable program code further comprises third computer readable program code for causing the computer to use said optimum exposure doses from said historical data.

8. The computer program product for controlling exposure dose as claimed in claim 6, wherein said resist sensitivity changes correspond to a step function from an old resist sensitivity to a new resist sensitivity; and, said first computer readable program code for causing the computer to calculate a batch factor further comprises fourth computer readable program code for causing the computer to calculate a batch factor of said exposure dose ratio of 1 for all lots run subsequent to said step function.

9. The computer program product for controlling exposure dose as claimed in claim 6, further comprising fifth computer readable program code for causing the computer to:

a) obtain said calculated batch factor for a lot run prior to an initial of said resist sensitivity changes;

b) obtain said calculated batch factor for a most recent previous lot run;

c) calculate a mixing factor for a previous lot run for modeling said resist sensitivity changes of said previous lot run due to flow characteristics of said resist;

d) calculate a mixing factor for a next lot run for modeling said resist sensitivity changes of said next lot run due to said flow characteristics of said resist;

e) calculate said calculated batch factor for a new lot run using the calculated batch factors of step a) and step b), and the calculated mixing factors of step c) and step d);

f) calculate said value of said exposure dose based on said historical data and said calculated batch factor for said new lot run.

10. The computer program product for controlling exposure dose as claimed in claim 6, further comprising sixth computer readable program code for causing the computer to:

apply an aging factor, to compensate for an ambient temperature of said resist, to said calculated batch factor wherein increased accuracy of said calculated batch factor is achieved;

apply said aging factor, to compensate for said ambient temperature of said resist, to said value of said exposure dose to increase accuracy of said exposure dose value.

11. A system for controlling a process parameter value for a material used in a process and having a batch factor which is a ratio of current material performance to previous material performance, and wherein the material is subject to batch changeover, and the system operates with successive lot runs including previous lot runs that were run prior in time and a current lot run that is currently being run, comprising:

means for adjusting said process parameter value as a function of material performance property changes, further comprising;

a) means for calculating a batch factor that is a ratio of current material performance to previous material performance by using historical data, comprising batch factors and an optimum of said process parameter value from at least one previous lot run that was run prior in time to the current lot run;

b) said means for adjusting said process parameter value comprises calculating said process parameter value based on said calculated batch factor whereby said process parameter value is controlled.

* * * * *